United States Patent
Coss, Jr. et al.

(10) Patent No.: US 6,954,883 B1
(45) Date of Patent: Oct. 11, 2005

(54) METHOD AND APPARATUS FOR PERFORMING FAULT DETECTION USING DATA FROM A DATABASE

(75) Inventors: Elfido Coss, Jr., Austin, TX (US); Michael R. Conboy, Austin, TX (US); Susan Hickey, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 537 days.

(21) Appl. No.: 10/044,340

(22) Filed: Jan. 11, 2002

(51) Int. Cl.[7] ............................................. G06F 11/00
(52) U.S. Cl. ........................... 714/47; 714/48; 700/121
(58) Field of Search ............................. 714/38, 37, 47, 714/48; 700/109, 121, 110; 438/5

(56) References Cited

U.S. PATENT DOCUMENTS

| | | | | |
|---|---|---|---|---|
| 5,643,044 | A | | 7/1997 | Lund ............................... 451/5 |
| 5,859,964 | A | * | 1/1999 | Wang et al. ................... 714/48 |
| 6,115,643 | A | * | 9/2000 | Stine et al. ................. 700/110 |
| 6,295,478 | B1 | * | 9/2001 | Inada ........................... 700/51 |
| 6,336,055 | B1 | * | 1/2002 | Cho ............................ 700/121 |
| 6,363,294 | B1 | * | 3/2002 | Coronel et al. ............. 700/121 |
| 6,532,555 | B1 | * | 3/2003 | Miller et al. .................. 714/48 |
| 6,587,744 | B1 | * | 7/2003 | Stoddard et al. ............ 700/121 |
| 6,645,780 | B1 | * | 11/2003 | Sonderman et al. .......... 438/14 |
| 6,766,208 | B2 | * | 7/2004 | Hsieh ......................... 700/109 |

* cited by examiner

*Primary Examiner*—Robert Beausoliel
*Assistant Examiner*—Marc Duncan
(74) *Attorney, Agent, or Firm*—Williams, Morgan & Amerson, P.C.

(57) ABSTRACT

A method and an apparatus for performing fault detection using real-time or near real-time data from a database. A first process on at least one semiconductor wafer is performed. Data is acquired on at least one of a real-time basis and a near real-time basis, the data comprising at least one of a process state data, a tool state data, and an integrated metrology data resulting from the first processing of semiconductor wafer. The data is stored in a database. A fault detection analysis is performed based upon the data acquired from the database based upon a trigger signal that causes data to be extracted from the database on a substantially real time basis.

29 Claims, 10 Drawing Sheets

METHOD AND APPARATUS FOR PERFORMING FAULT DETECTION USING DATA FROM A DATABASE

BACKGROUND OF THE INVENTION

1. Field of the Invention

This invention relates generally to semiconductor manufacturing, and, more particularly, to a method and apparatus for performing fault detection using data, such as real-time data from a database, such as a database.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (deposition, etching, ion implanting, or the like), to the packaging and final testing of the completed device, are so different from one another and specialized that the processes may be performed in different manufacturing areas or locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be used for a variety of purposes, e.g., in a gate electrode structure for transistors. The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die 155 arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, one example of a block diagram representation of a typical manufacturing process flow is illustrated. A manufacturing system prompts a first processing tool to perform a process upon a plurality of semiconductor wafer 105 (block 210). A manufacturing data acquisition tool (e.g., a metrology tool) then analyzes at least some of the processed semiconductor wafers 105 (block 220), and produces offline metrology data. The metrology data acquired is then analyzed in a data analysis tool, e.g., a computer. The analyzed data can then be used to adjust various parameters related to manufacturing control of subsequent processes in order to reduce any effects of existing manufacturing errors (block 230). Once the manufacturing data analysis is performed, manufacturing data for fault detection is made available to the manufacturing system (block 240). Many times, the manufacturing data is stored in a database, for later retrieval. Often, the flow of the manufacturing process occurs at such a rate that manufacturing data for fault detection is not timely available.

In addition to offline metrology data, manufacturing data relating to the state of the processing tool and data relating to the process itself may be acquired. Often, a large amount of real-time data may be acquired during processing of semiconductor wafers 105. However, processing the acquired real-time data in an efficient manner in order to use the data to improve manufacturing of semiconductor wafers 105 may be difficult using state-of-the-art systems. Often, real-time data acquired during semiconductor manufacturing processes may go under-utilized or even unused.

The present invention is directed to overcoming, or at least reducing the effects of, one or more of the problems set forth above.

SUMMARY OF THE INVENTION

In one embodiment of the present, a method is provided for performing fault detection using real-time or near real-time data from a database. A first process on at least one semiconductor wafer is performed. Data is acquired on at least one of a real-time basis and a near real-time basis, the data comprising at least one of a process state data, a tool state data, and an integrated metrology data resulting from the first processing of semiconductor wafer. The data is stored in a database. A fault detection analysis is performed based upon the data acquired from the database based upon a trigger signal that causes data to be extracted from the database on a substantially real time basis.

In another embodiment of the present invention, a system is provided for performing fault detection using real-time or near real-time data from a database. The system of the present invention comprises: a process controller to perform a fault detection using substantially real-time data from a database. The fault detection comprises: performing a first process on at least one semiconductor wafer; acquiring data on at least one of a real-time basis and a near real-time basis, the data comprising at least one of a process state data, a tool state data, and an integrated metrology data resulting from the first processing of semiconductor wafer; storing the data in a database; and performing a fault detection analysis based upon the data acquired from the database based upon a trigger signal that causes data to be extracted from the database on a substantially real time basis. The system of the present invention further comprises a database operatively coupled to the process controller, the database to acquire the data in a substantially real-time basis and to provide the processed data to the process controller for performing the fault detection.

BRIEF DESCRIPTION OF THE DRAWINGS

The invention may be understood by reference to the following description taken in conjunction with the accompanying drawings, in which like reference numerals identify like elements, and in which.

Figure 1:
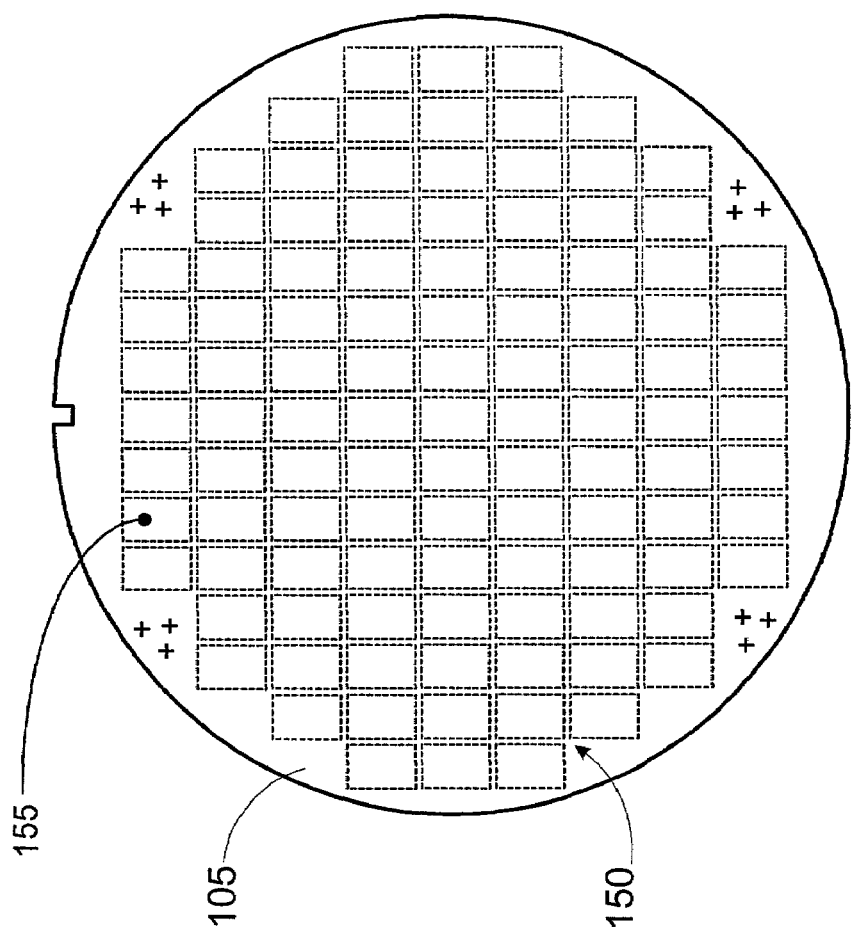
FIG. 1 is a simplified diagram of a prior art semiconductor wafer being processed.
Figure 2:
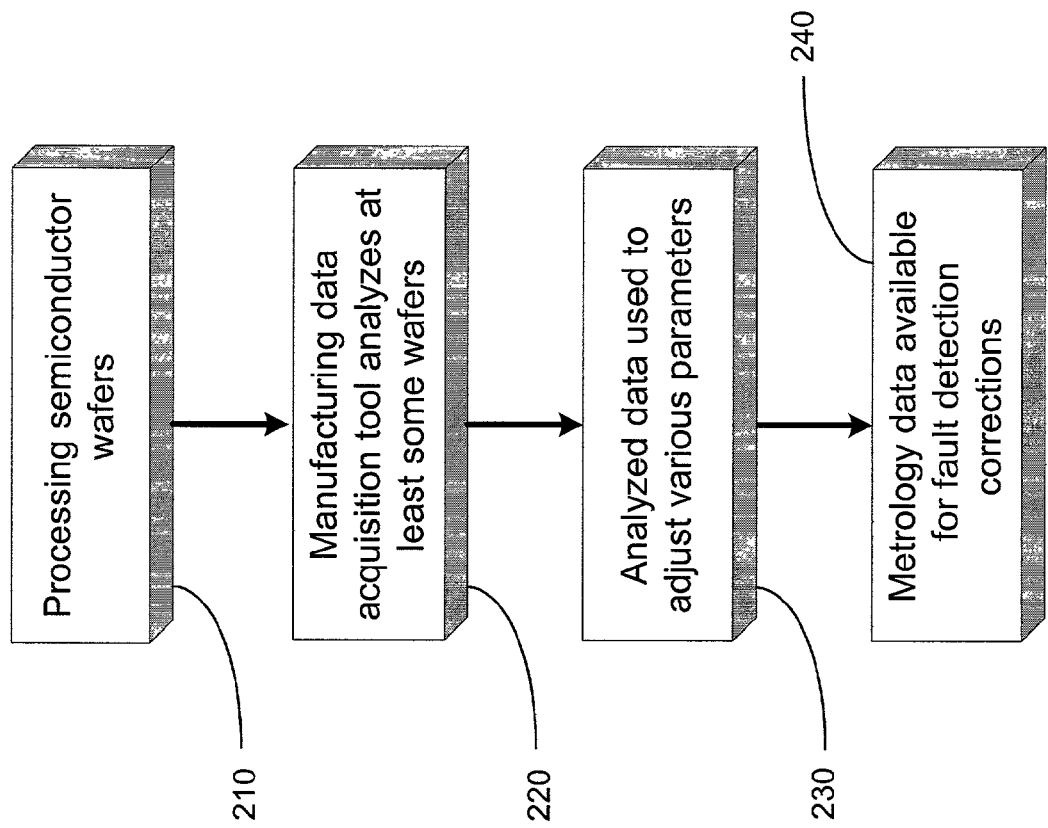
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Errors that can occur during the processing of semiconductor wafers 105, such as forming transistor structures on a layer of the semiconductor wafers 105, can be measured and characterized. The measured and characterized errors can then be used to improve and correct certain processing steps that may result in processed semiconductor wafers 105 of higher quality and accuracy. Data relating to the measure and characterized errors, acquired on a real-time basis during a process flow, may be stored in a database, such as a database. Furthermore, data relating to the processing tool (e.g., tool state data, such as the temperature, operation settings, etc.) and data relating to the process flow itself (e.g., process state data) may be acquired on a real-time basis and stored in the database. Improvements in accuracy and efficiency of processing of semiconductor wafers 105 may be achieved by proper storage and access of real-time and/or near real-time data stored in the database.

Embodiments of the present invention provide for acquiring a plurality of sets of data during manufacturing processes and utilizing such data to perform fault detection and/or adjustments based upon the fault detection. The embodiments of the present invention provide for acquiring manufacturing data comprising metrology data, which may include integrated metrology data and offline metrology data (described below), tool state data, and process state data in a real-time or near real-time fashion. The real-time data may be stored into a database and acquired at predetermined intervals and/or trigger points for use in fault detection. Embodiments of the present invention provide for calculating and generating triggers that acquire data stored into a database such that substantially real-time fault detection can be performed during processing of semiconductor wafers 105.

Figure 3:
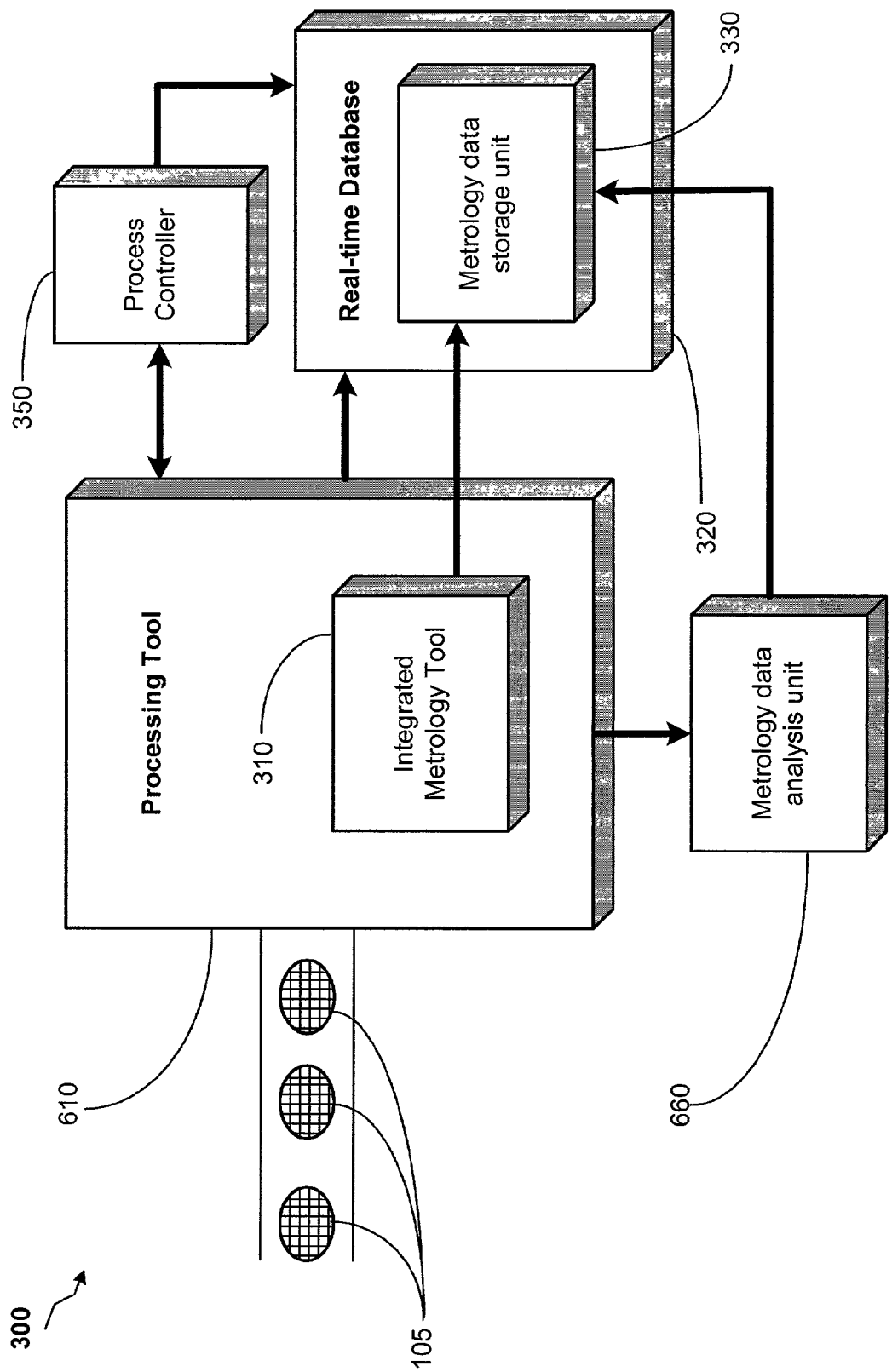
FIG. 3 is a block diagram representation of a system in accordance with one illustrative embodiment of the present invention.

Turning now to FIG. 3, a system 300 capable of performing the methods taught by one embodiment of the present invention, is illustrated. In one embodiment, a processing tool 610 comprises an integrated metrology tool 310. In one embodiment, the integrated metrology tool 310 may be incorporated into the flow of semiconductor wafers 105 through a processing tool 610. In other words, the semiconductor wafers 105 generally pass through the integrated metrology tool 310, as the wafers 105 would pass through other processing stations (not shown) in the processing tool 610. The integrated metrology tool 310 is capable of acquiring integrated metrology data (e.g., acquiring metrology data of semiconductor wafers 105 while they are still under the control of the processing tool 610), which includes inline metrology data. The inline metrology data acquired by the integrated metrology tool 310 may be acquired before and/or after the desired processing operations are performed on the wafer in the processing tool 610. Acquiring inline metrology data is generally less intrusive to a manufacturing process flow, as compared to acquiring offline metrology data, which requires the use of an external metrology data tool.

In one embodiment, inline metrology data includes metrology data acquired by a standalone metrology tool (such as an offline metrology tool 650 shown in FIG. 4) yielding data associated with a particular processing operation. For example, inline metrology data may include data relating to film thickness, line-width of certain features on processed semiconductor wafers 105, overlay measurements resulting from photolithography measurements, and the like.

The integrated metrology data acquired by the integrated metrology tool 310 may include inline metrology data that is acquired in a more real-time fashion. Inline metrology data acquired by the integrated metrology tool 310 may be used to perform fault detection analysis upon semiconductor wafers 105 being processing by the processing tool 610.

The integrated metrology tool 310 acquires metrology data in an inline fashion. In other words, during, or immediately following a manufacturing process, the integrated metrology tool 310 acquires data from the processed semiconductor wafers 105. In one embodiment, the integrated metrology tool 310 is placed within a chamber (not shown) associated with the processing tool 610. In one embodiment, the integrated metrology tool 310 sends metrology data (real-time or near real-time data) to a metrology data storage unit 330. In one embodiment, near real-time data may include data that is acquired from a semiconductor wafer 105 in a lot before the processing of the entire lot is complete. The metrology data storage unit 330 stores the metrology data such that it can be retrieved by the system 300 for further analysis during or after a manufacturing process cycle. In one embodiment, the metrology data storage unit 330 is integrated into a database 320, which in one embodiment is a real-time database (i.e., a database that stores real-time data). The database 320 may receive tool state data from the processing tool 610 and process state data from the process controller 350.

Data from the integrated metrology tool 310 may also be sent to the metrology data analysis unit 660. The metrology analysis unit 660 is capable of correlating particular metrology data to corresponding semiconductor wafers 105. In one embodiment, metrology data analysis unit 660 also sends metrology data to the metrology data storage unit 330 for storage. The real-time, or near real-time, metrology data stored in the metrology data storage unit 330 provides the system 300 access to immediate manufacturing data that can be used to perform fault detection during the processing of semiconductor wafers 105.

In addition to the integrated metrology data, the database 320 may also receive tool state data and/or process state data that may also include metrology data acquired from processed semiconductor wafers 105. The metrology data may comprise offline metrology data and/or integrated metrology data. The database 320 is capable of acquiring real-time data and storing it in an organized fashion such that a process controller 350 that controls the operation of the manufacturing of semiconductor wafers 105 may acquire all or a portion of the data stored in the database 320 for purposes of fault detection. The database 320 may comprise a metrology data storage unit 330 that stores acquired offline and/or integrated metrology data. Data stored in the database 320 may be acquired in a sampled fashion where data at particular intervals are retrieved for fault detection purposes. The database 320 may be a portion of a computer system 300 that may include an array of data storage devices (not shown), such as disk drives, optical data storage drives, and the like.

Figure 4:
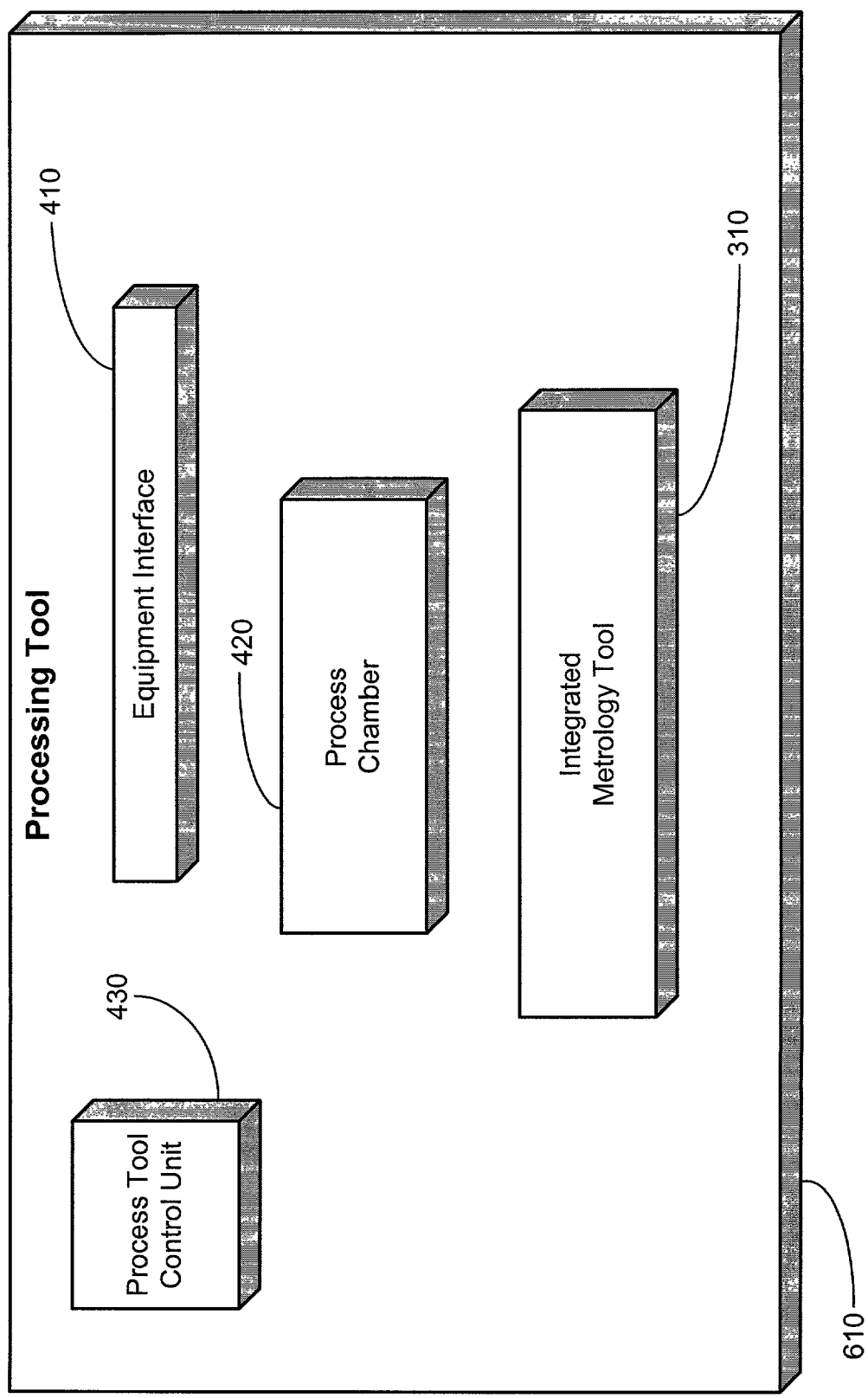
FIG. 4 illustrates a more detailed block diagram representation of a processing tool shown in FIG. 3, in accordance with one illustrative embodiment of the present invention.

Turning now to FIG. 4, a more detailed block diagram illustration of an illustrative processing tool, such as processing tool 610 is shown. In one embodiment, the processing tool 610 comprises an equipment interface 410, a process chamber 420, a processing tool control unit 430, and an integrated metrology tool 310. The processing tool 610 receives control parameter data via the equipment interface 410. Data from the processing tool 610 is also sent to other portions of the system 300, such as the computer system 630, via the equipment interface 410. The processing tool control unit 430 controls processing operations of semiconductor wafers 105 in the process chamber 420. The process tool control unit 430 receives control parameter data, and/or instructions from the computer system 630, via the equipment interface 410, and executes the appropriate action.

The integrated metrology tool 310 acquires metrology data of the semiconductor wafers 105 that were processed in the process chamber 420. The process tool control unit 430 also controls the integrated metrology tool 310. In accordance with embodiments of the present invention, the integrated metrology tool 310 acquires real-time or near real-time metrology data from semiconductor wafers 105 processed and makes such data available to the system 300 for more efficient and quick analysis of metrology data.

Figure 5:
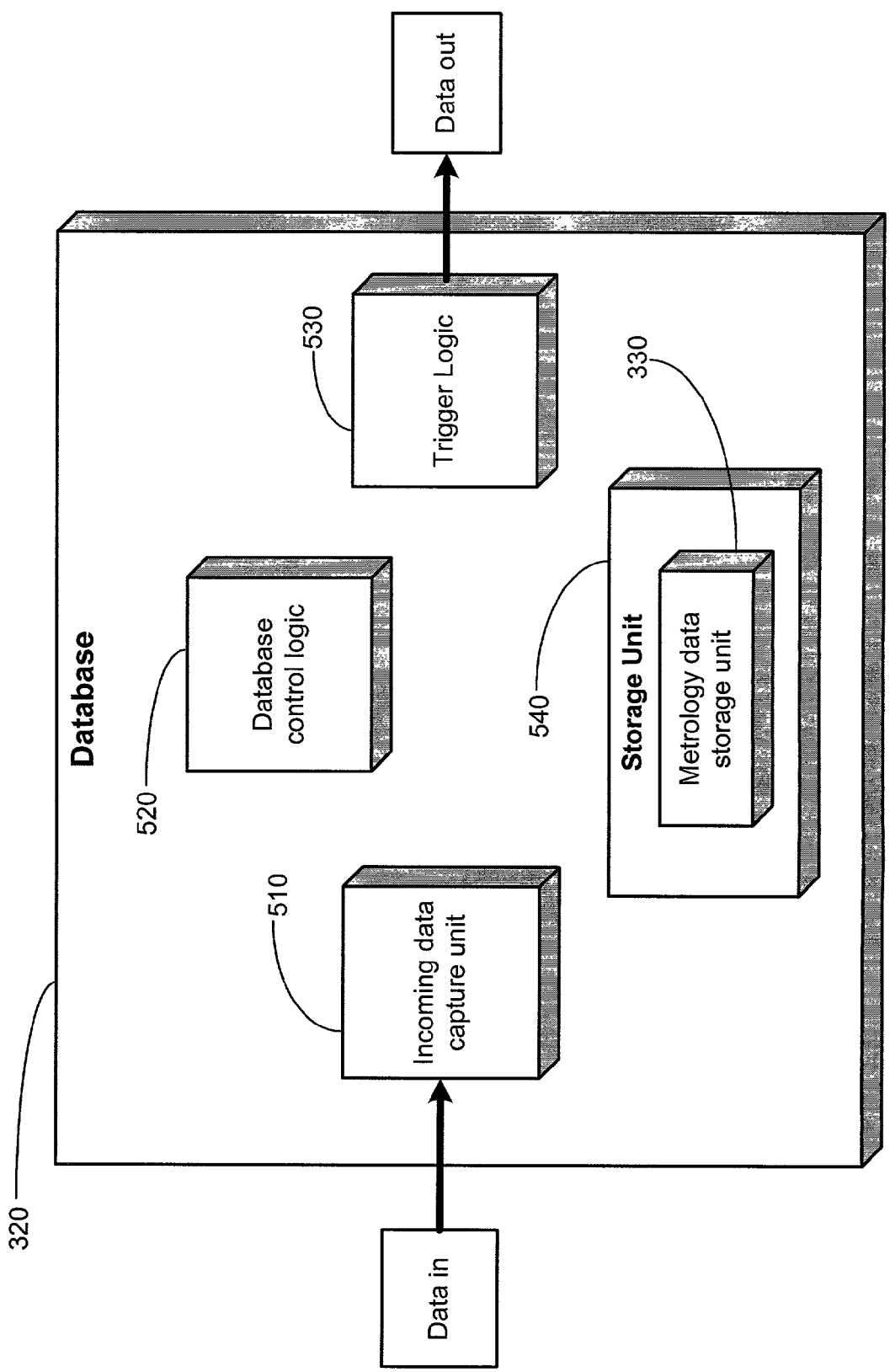
FIG. 5 illustrates a block diagram representation of a database of FIG. 4 in accordance with one illustrative embodiment of the present invention.

Turning now to FIG. 5, a block diagram of one embodiment of the database 320 is illustrated. FIG. 5 illustrates data being received and provided by the database 320. The rate at which the data is received by the database 320 may vary from the rate at which the data is extracted from the database 320. Compression and/or expansion of the data may be performed before data is sent out of the database 320. In one embodiment, compression and/or expansion of the data may be performed by data-manipulating algorithms. In one embodiment, the database 320 comprises an incoming data capture unit 510, a database control logic 520, a trigger logic 530, and a metrology storage unit 330. The incoming data capture unit 510 is capable of acquiring data relating to processing of semiconductor wafers 105. In one embodiment, the incoming data capture unit 510 tracks the manufacturing flow and captures real-time data from various areas of the manufacturing area. The incoming data capture unit 510 may combine certain sets of data and/or create association between certain sets of data. For example, tool state data may be combined or associated with corresponding process state data from a particular processing step. This may be a form of expansion of the acquired data to form a new set of combined/integrated data. Mathematical equations and/or functions can be used to combine, merge, expand, and/or contract the data received by the database 320. The equations or functions may be used to filter the data, such as filtering based upon predetermined limit-checks on the data, removing unwanted data, and the like.

The database control logic 520 provides control functions of the database 320 and provides data access and extraction capabilities to a system 300 monitoring the data stored in the database 320. Therefore, a process controller 350 may direct particular data into the database 320, manipulate the data, and access the data on a real-time or a near real-time basis. The database 320 also comprises a trigger logic 530 that provides a triggering function to control the rate of flow of data extracted from the database 320. In one embodiment, the trigger logic 530 may be controlled by a logic that is external to the database 320. The trigger logic 530 will cause the data stored in the storage unit 540 to be extracted in response to a trigger signal generated by the trigger logic 530. In an alternative embodiment, the trigger signal may be generated by a component external to the database unit 320, such as the process controller 350.

Figure 6:
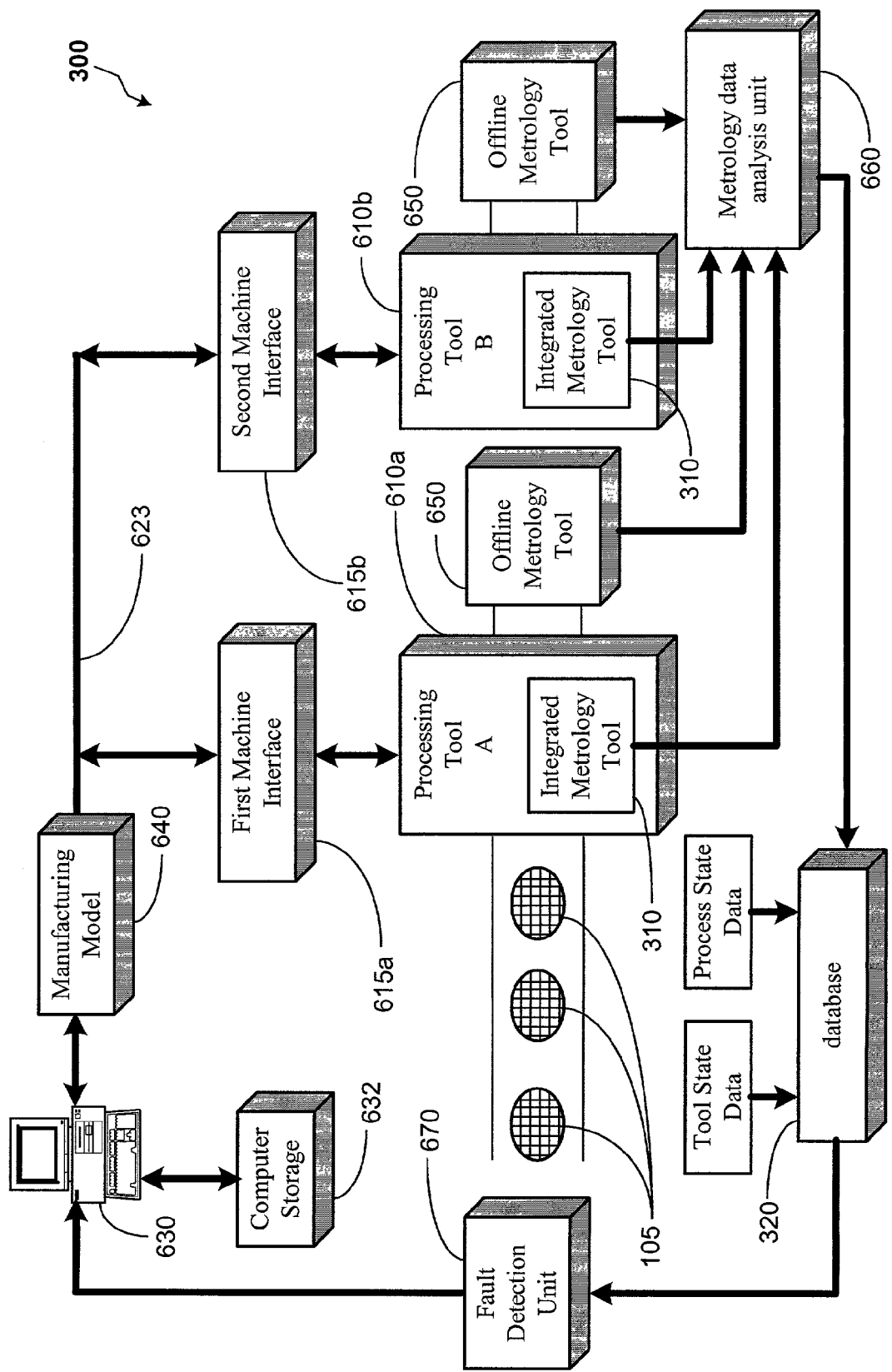
FIG. 6 illustrates a more detailed block diagram representation of the system shown in FIG. 3, in accordance with one illustrative embodiment of the present invention.

Turning now to FIG. 6, a more detailed block diagram of the system 300 in accordance with one embodiment of the present invention is illustrated. In one embodiment, semiconductor wafers 105 are processed on processing tools 610*a*, 610*b* using a plurality of control input signals, or manufacturing parameters, provided via a line or network 623. In one embodiment, control input signals, or manufacturing parameters, on the line 623 are sent to the processing tools 610*a*, 610*b* from a computer system 630 via machine interfaces 615a, 615b. In one embodiment, the first and second machine interfaces 615a, 615b are located outside the processing tools 610a, 610b. In an alternative embodiment, the first and second machine interfaces 615a, 615b are located within the processing tools 610a, 610b. The semiconductor wafers 105 are provided to and carried from a plurality of processing tools 610. The semiconductor wafers 105 may be provided to the processing tool 610 manually, or they may be provided to the processing tool 610 in an automatic fashion (e.g., robotic movement of semiconductor wafer 105). In one embodiment, a plurality of semiconductor wafers 105 are transported in lots (e.g., stacked in cassettes) to the processing tool 610.

In one embodiment, the computer system 630 sends control input signals, or manufacturing parameters, on the line 623 to the first and second machine interfaces 615a, 615b. The computer system 630 is capable of controlling processing operations. In one embodiment, the computer system 630 is a process controller 350. The computer system 630 is coupled to a computer storage unit 632 that may contain a plurality of software programs and data sets. The computer system 630 may contain one or more processors (not shown) that are capable of performing the operations described herein. The computer system 630 employs a manufacturing model 640 to generate control input signals on the line 623. In one embodiment, the manufacturing model 640 contains a manufacturing recipe that determines a plurality of control input parameters that are sent on the line 623 to the processing tools 610a, 610b.

In one embodiment, the manufacturing model 640 defines a process script and input control that implement a particular manufacturing process. The control input signals (or control input parameters) on the line 623 that are intended for processing tool A 610a are received and processed by the first machine interface 615a. The control input signals on the line 623 that are intended for processing tool B 610b are received and processed by the second machine interface 615b. Examples of the processing tools 610a, 610b used in semiconductor manufacturing processes are steppers, etch process tools, deposition tools, and the like.

One or more of the semiconductor wafers 105 that are processed by the processing tools 610a, 610b can also be sent to an offline metrology tool 650 for acquisition of metrology data. The offline metrology tool 650 can be an optical data acquisition tool, an overlay-error measurement tool, a critical dimension measurement tool, and the like. In one embodiment, one or more processed semiconductor wafers 105 are examined by an offline metrology tool 650. Furthermore, metrology data may also be collected by the integrated metrology tool 310 within the processing tools 610a and 610b. Data from the integrated metrology tool 310 and the offline metrology tool 650 may be collected by the metrology data analysis unit 660. The metrology data is directed to a variety of physical or electrical characteristics of the devices formed on the wafers 105. For example metrology data may be obtained as to line width measurements, depth of trenches, sidewall angles, thickness, resistance, and the like. As described above, the metrology data analysis unit 660 organizes, analyzes, and correlates metrology data acquired by the offline metrology tool 650 to particular semiconductor wafers 105 that were examined.

In one embodiment, the metrology data analysis unit 660 sends metrology data (including inline-type metrology data) and offline metrology data, from the integrated metrology tool 310 and offline metrology tool 650, respectively, to the database 320 for storage and/or access for analysis. The database 320 receives metrology data, which includes offline and integrated metrology data, as well as other data such as tool state data and process state data. The database 320 may correlate the metrology data with corresponding tool state data and/or process state data, thereby expanding and/or contracting the data for fault detection analysis.

Data from the database 320 may be extracted by a fault detection unit 670 for performing fault detection analysis based upon data from the database 320. The fault detection unit 670 provides fault detection data to the computer system 630, which may use the fault detection data/analysis to improve the operation of the semiconductor wafer 105 manufacture processes. In one embodiment, the fault detection unit 670 may be a software function, a hardware circuit, and/or a firmware component of a standalone unit or unit(s) integrated into the computer system 630. Using the inventive trigger extraction of data from the database 320, the system 300 is able to operate more accurately and provide faster feedback data for subsequent operation of processing semiconductor wafers 105.

Figure 7:
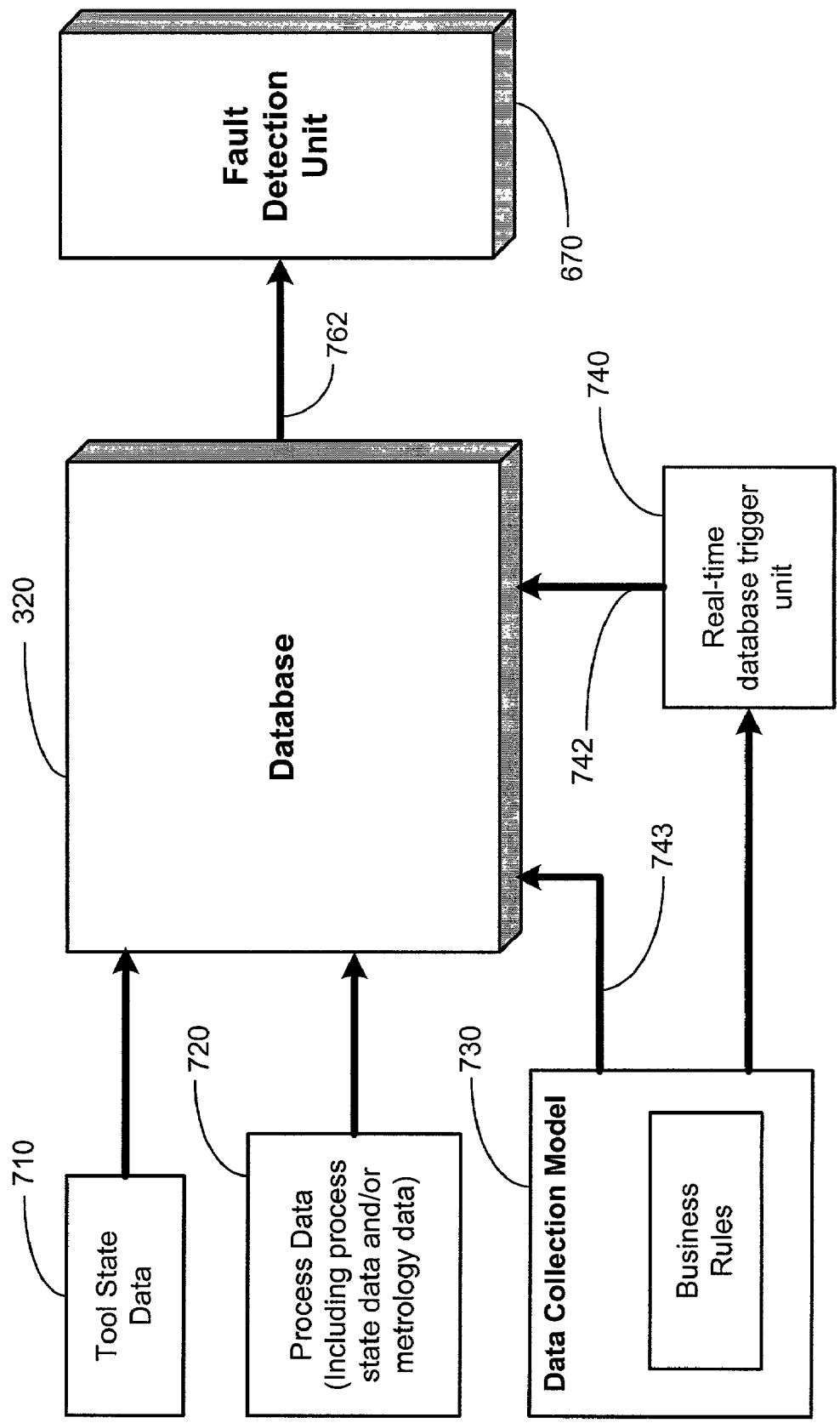
FIG. 7 illustrates a block diagram representation of a typical data flow into and out of the database of FIGS. 3 and 5, in accordance with one illustrative embodiment of the present invention.

Turning now to FIG. 7, a block diagram representation of the operation of data extraction from the database 320 in accordance with one illustrative embodiment of the present invention is shown. The database 320 receives tool state data 710 and process data 720, which includes process state data, integrated metrology data, and/or offline metrology data. The database 320 receives a trigger signal on a line 742 from a database trigger unit 740, which may be a trigger logic 530 or a software unit located in the computer system 630. In one embodiment, a trigger signal on a line 743 may result from the data collection model 730. In one embodiment, the data collection model 730 is a model that provides a directive to collect data based upon certain pre-programmed/pre-determined instances. The data collection model 730 may comprise business rules that may be utilized to provoke collection of certain types of data. Examples of business rules include limits placed upon checking on process recipes, setting process recipe updates, and the like.

Some examples of the trigger signal may be triggering an extraction of particular data based upon a threshold value detected on a particular metrology data. A trigger signal may also be a temperature set point detected in the tool state data 710. Other trigger signals based upon process state data 720, tool state data 710, a combination of the two, etc. may be used to trigger data out of the database 320. The database 320 supplies data on the line 762 to the fault detection unit 670. Based upon the trigger signal, data (including real-time data) may be sent to the fault detection unit 670 at a rate determined by an operator who controls the process flow of the system 300. In one instance, the data sent out on the line 762 may coincide with the data received by the database 320. However, the data sent out on the line 762 from the database 320 may be slower than the rate of data received by the database 320. In an alternative embodiment, the data rate of the data sent out on the line 762 may be greater than the data rate of the rate of data received by the database 320, which includes sending offline acquired data and stored data from the database 320. The fault detection unit 670 may then perform fault detection analysis based upon the data received on the line 762.

Figure 8:
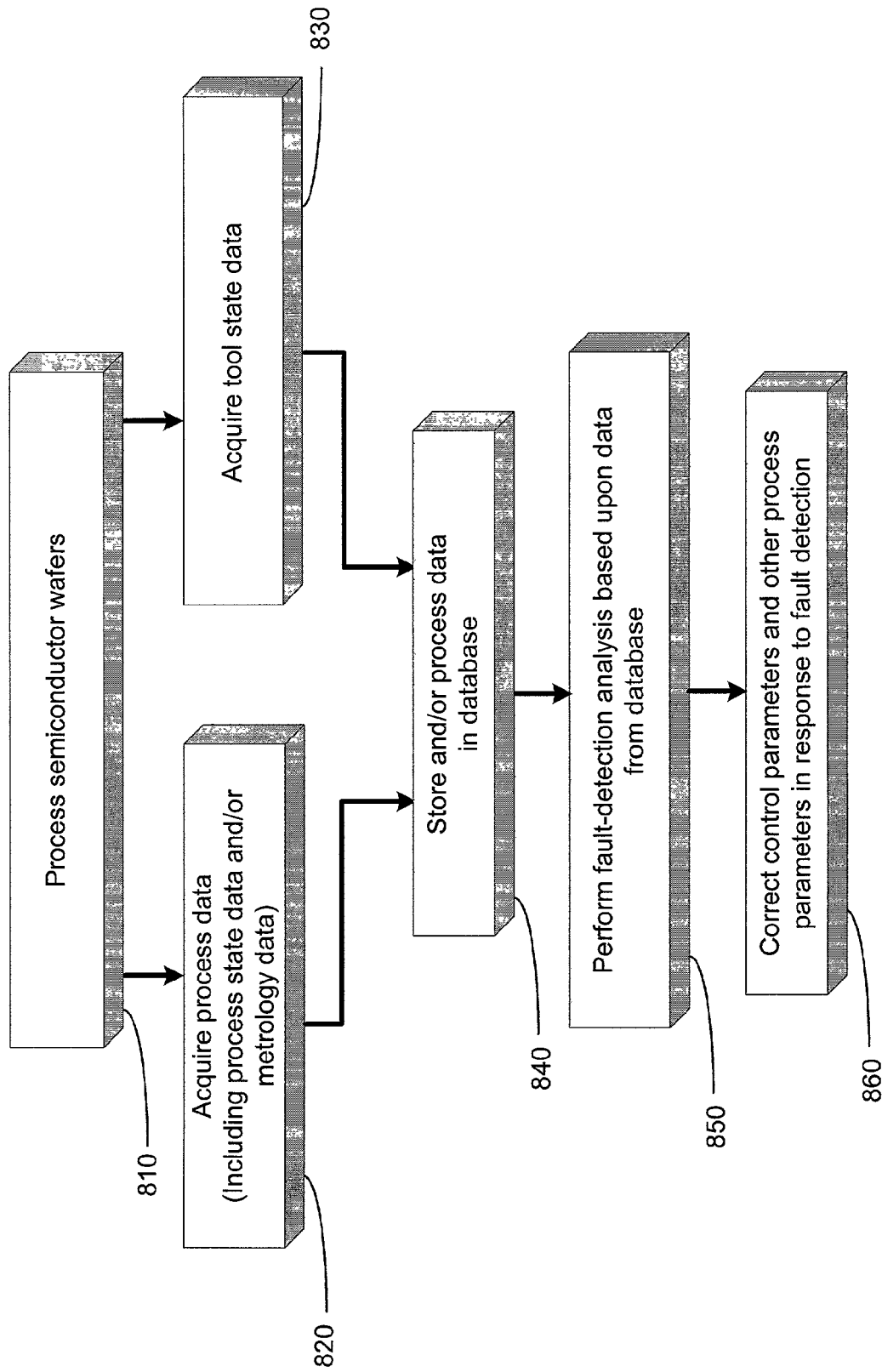
FIG. 8 illustrates a flowchart depiction of a method in accordance with one illustrative embodiment of the present invention.

Turning now to FIG. 8, a flow chart illustration of the method in accordance with one embodiment of the present invention is illustrated. One, or a plurality of semiconductor wafers 105, may be processed by the system 300 (block 810). Upon processing of at least one semiconductor wafer 105, the system 300 acquires process data that may include process state data 720, offline metrology data, and/or integrated metrology data (block 820). The system 300 may also acquire tool state data 710 that corresponds to the acquired process state data 720 (block 830). The process data 720 and the tool state data 710 may be stored into the database 320 in a real-time or in a near real-time basis (block 840). Furthermore, the data stored in the database 320 may be processed for subsequent fault detection analysis. A more detailed illustration of the steps for storing and/or processing data into the database 320 is illustrated in FIG. 9 and accompanying description provided below.

Figure 10:
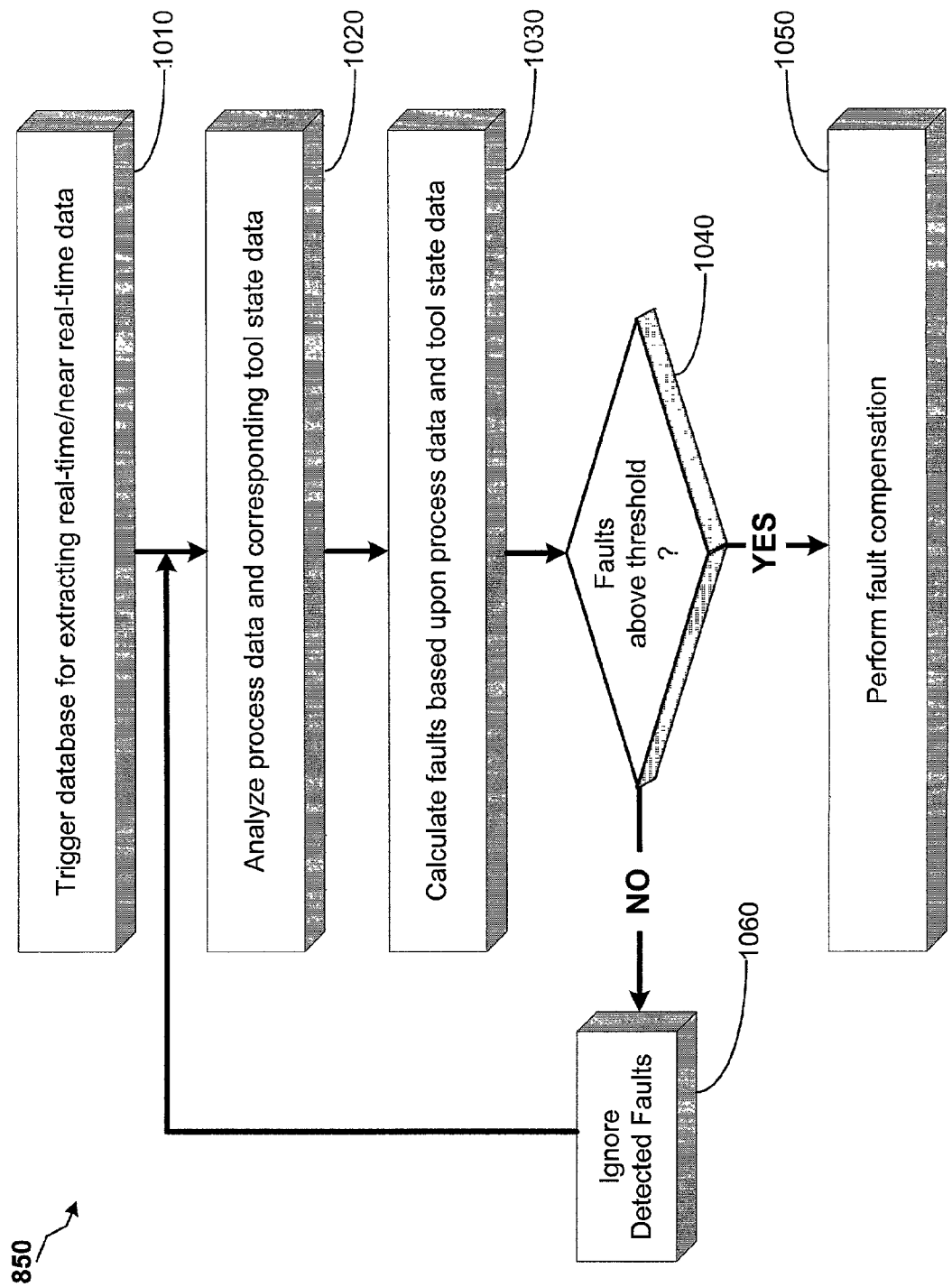
FIG. 10 illustrates a flowchart depiction of a method of performing a fault detection analysis based upon data from the database, as indicated in FIG. 8, in accordance with illustrative one embodiment of the present invention.

The system 300 may then perform a fault detection analysis based upon data from the database 320 (block 850). A more detailed illustration of the steps for performing the fault detection analysis is illustrated in FIG. 10 and accompanying description provided below. Subsequently, correction of particular control parameters and/or subsequent techniques for processing semiconductor wafers 105 may be performed in response to the fault detection (block 860). For example, the temperature setting of a processing tool 610 may be adjusted, a time-period of an etch-process may be modified, etc., based upon the fault detection analysis. Furthermore, qualification of particular processed wafers 105 may be made based upon the fault detection analysis.

Figure 9:
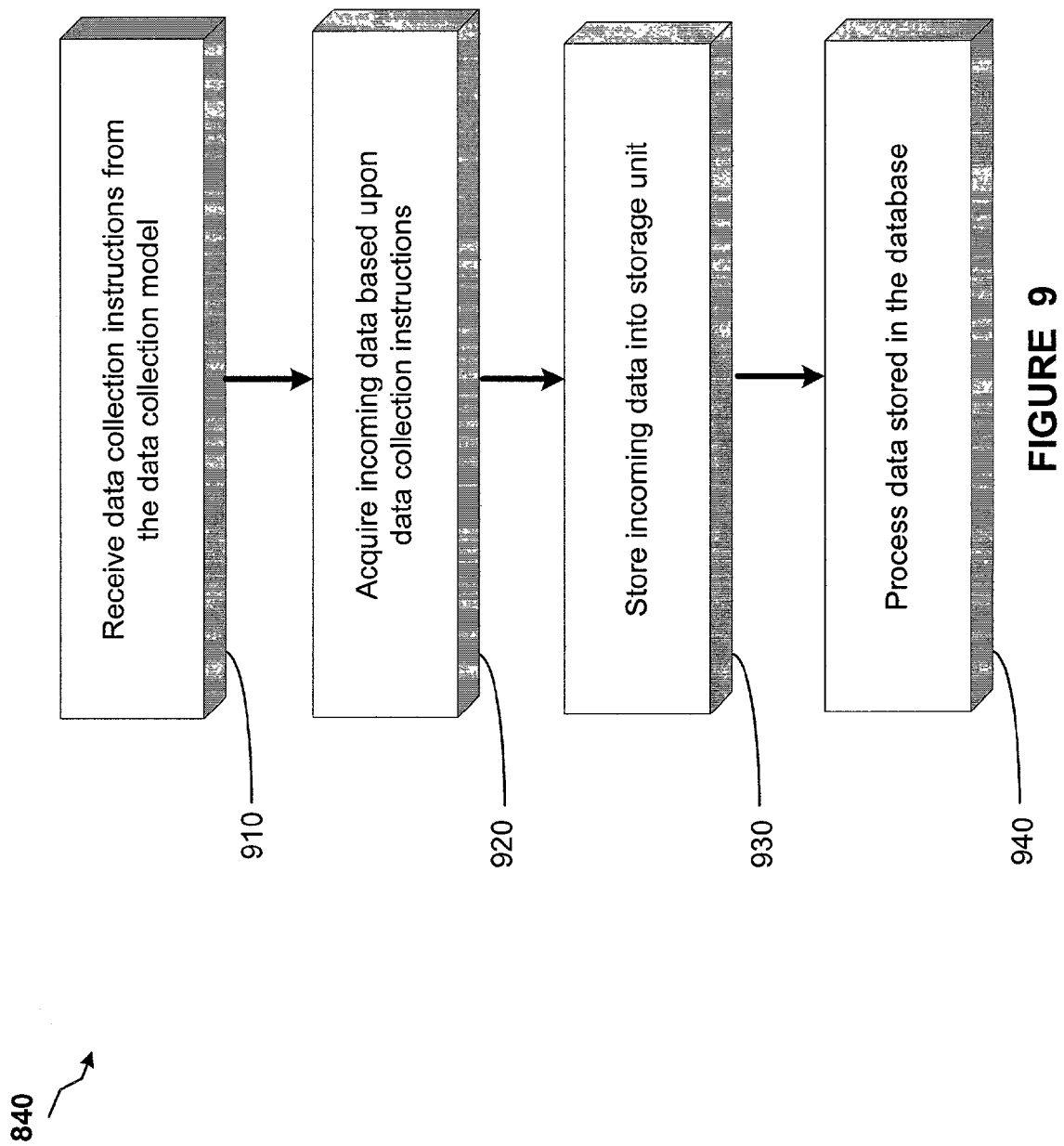
FIG. 9 illustrates a flowchart depiction of a method storing data into the database, as indicated in FIG. 8, in accordance with one illustrative embodiment of the present invention.

Turning now to FIG. 9, a flow chart depiction of the step of storing data into the database 320, in accordance with one illustrative embodiment of the present invention, is illustrated. In one embodiment, the system 300 provides data collection instructions for the operation of the database 320 from the data collection model 730 (block 910). The data collection model 730 may comprise a plurality of instructions and/or predetermined routines that provide for the manner in which data is entered into the database 320 (block 910). The instructions and/or routines may be formulated using business rules that were described above. The system 300 then acquires incoming data based upon the data collection instructions (block 920). The incoming data may be acquired at a real-time rate as the data is generated during the processing of semiconductor wafers 105. In an alternative embodiment, the incoming data may be a sampled version of the real-time process data 720 and/or tool state data 710.

When the database 320 acquires the data from the processing of semiconductor wafers 105 (e.g., tool state data 710 and process data 720), the data may be stored into the storage unit 540 associated with the database 320 (block 930). In one embodiment, the data stored in the storage unit 540 is stored in a FIFO (first-in-first-out) format for facilitating real-time and/or near real-time data access. In one embodiment, data in the database 320 is processed for fault detection analysis (block 940). The processing of the data comprises combining, merging, expanding, and/or contracting portions of the data received by the database 320.

Turning now to FIG. 10, a flow chart depiction of the steps for performing fault detection based upon data from the database 320, as indicated in block 850 of FIG. 8, is illustrated. The system 300 triggers the database 320 for extracting real-time or near real-time data stored in the database 320 (block 1010). The trigger may be provided by the trigger logic 530 in the database 320 or by a trigger signal originating external to the database 320. The system 300 then analyses the process data 720 and its corresponding tool state data 710 (block 1020). This analysis may comprise a correlation of process state data 720 to particular tool state data 710, and checking for errors and/or miss-processing of particular semiconductor wafers 105. Based upon the data acquired from the database 320, the system 300 calculates particular faults based upon predetermined conditions, calculations, and/or expectations of the performance of processing steps employed on the semiconductor wafers 105.

The system 300 examines the calculated/detected faults and compares them to predetermined tolerance/threshold levels to determine whether the calculated faults are above the predetermined tolerance/threshold levels (block 1040). Based upon a determination that the calculated faults are not above a predetermined tolerance/threshold level, the system 300 may ignore such faults (block 1060) and repeat the process of triggering the database 320 for acquiring further sets of real-time or near real-time data. When the system 300 determines that the calculated fault is above a predetermined tolerance/threshold level, a fault compensation process is initiated by the system 300 (block 1050). The fault compensation process may include modification to operation parameters of the processing tools 610, modifications to control input parameters that control the processing of semiconductor wafers 105, and the like. Utilizing the methods described in FIGS. 8–10, a particular set of real-time data may be acquired at a plurality of data rates in order to perform more efficient checking of fault detection during processing of semiconductor wafers 105. The teachings of the present invention can be utilized for a variety of database applications, including real-time data acquisition for a variety of technology driven applications.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
performing a first process on at least one semiconductor wafer;
acquiring data on at least one of a real-time basis and a near real-time basis, said data comprising at least one of a process state data, offline metrology data, a tool state data, and an integrated metrology data resulting from said first processing of semiconductor wafer;
storing said data in a database; and
performing a fault detection analysis based upon said data acquired from said database based upon a trigger signal that causes data to be extracted from said database on a substantially real time basis.

2. The method described in claim 1, further comprising performing a second process on a semiconductor wafer based upon processing modifications made in response to said fault detection.

3. The method described in claim 1, wherein acquiring metrology data resulting from said first process of semiconductor wafer further comprises acquiring integrated metrology data using an integrated metrology tool.

4. The method described in claim 1, wherein storing said data in a database further comprises:
receiving data collection instructions from a data collection model, said data collection model based upon at least one business rule;
acquiring data incoming into the database based upon said collection instructions;
storing said incoming data into a storage unit in said database; and
processing said stored data in said database, said processing comprising at least one of combining, merging, expanding, and contracting at least portions of said data acquired by said database.

5. The method described in claim 4, wherein expanding said data further comprises attaching a process state data with a corresponding tool state data.

6. The method described in claim 1, wherein performing a fault detection analysis based upon said data acquired from said database on one of a real-time basis and a near real-time basis further comprises:
triggering said database for extracting said data;
analyzing said data triggered from said database;
detecting a fault based upon said analysis of said triggered data; and
performing a fault compensation process in response to a determination that a calculated fault is above a predetermined tolerance level.

7. The method described in claim 6, wherein triggering said database for extracting said data further comprises providing a triggering signal to said database to extract said data from said database.

8. The method described in claim 7, wherein triggering said database for extracting said data further comprises triggering said database at a rate that is substantially same as a rate of data flow into said database.

9. The method described in claim 7, wherein triggering said database for extracting said data further comprises triggering said database at a rate that is lower than the rate of data flow into said database.

10. The method described in claim 1, wherein storing said data in a database further comprises storing said data in a real-time database.

11. A method, comprising:
performing a first process on at least one semiconductor wafer;
acquiring data comprising at least one of a process state data, a tool state data, and a metrology data, including offline metrology data, resulting from said first process of semiconductor wafer on a substantially real-time basis;
storing said data in a database;
extracting said data from said database based upon a trigger signal directed to said database, said trigger signal being capable of extracting said data from said database at a substantially real-time rate;
performing a fault detection analysis based upon said extracted data acquired from said database; and
performing a second process on a semiconductor wafer based upon processing modifications made in response to said fault detection.

12. The method described in claim 11, wherein storing said data in a database further comprises:
receiving data collection instructions from a data collection model, said data collection model based upon at least one business rule;
acquiring data incoming into the database based upon said collection instructions;
storing said incoming data into a storage unit in said database; and
processing said stored data in said database, said processing comprising at least one of combining, merging, expanding, and contracting at least portions of said data acquired by said database.

13. The method described in claim 11, wherein triggering said database for extracting said data further comprises triggering said database at a rate that is lower than the rate of data flow into said database.

14. An apparatus, comprising:
means for performing a first process on at least one semiconductor wafer;
means for acquiring data on at least one of a real-time basis and a near real-time basis, said data comprising at least one of a process state data, offline metrology data, a tool state data, and an integrated metrology data resulting from said first processing of semiconductor wafer;
means for storing said data in a database; and
means for performing a fault detection analysis based upon said data acquired from said database based upon a trigger signal that causes data to be extracted from said database on a substantially real time basis.

15. A system, comprising:
a process controller to perform a fault detection using substantially real-time data from a database, said fault detection comprising:
performing a first process on at least one semiconductor wafer;
acquiring data on at least one of a real-time basis and a near real-time basis, said data comprising at least one of a process state data, offline metrology data, a tool state data, and an integrated metrology data resulting from said first processing of semiconductor wafer;

storing said data in a database;
performing a fault detection analysis based upon said data acquired from said database based upon a trigger signal that causes data to be extracted from said database on a substantially real time basis; and
a database operatively coupled to said process controller, said database to acquire said data in a substantially real-time basis and to provide said processed data to said process controller for performing said fault detection.

16. The system of claim 15, further comprising:
a computer system operatively coupled with said database, said computer system to perform at least one calculation for performing said fault detection;
a manufacturing model operatively coupled with said computer system, said manufacturing model to generate and modify at least one control input parameter signal based upon said fault detection;
a machine interface operatively coupled with said manufacturing model, said machine interface being capable of receiving process recipes from said manufacturing model;
a processing tool capable of processing semiconductor wafers and operatively coupled with said machine interface and said database, said processing tool to receive at least one control input parameter signal from said machine interface and to provide substantial real-time data to said database;
an integrated metrology tool integrated with said processing tool, said integrated metrology tool to acquire said integrated metrology data and sending said integrated metrology data to said database; and
a fault detection analysis unit operatively coupled to said computer system and said database, said fault detection analysis unit to acquire said data from said database based upon a trigger signal and to perform fault detection analysis data to said computer system for said fault detection calculation.

17. The system of claim 16, wherein said computer system is capable of generating modification data for modifying at least one parameter in said manufacturing model in response to said fault detection analysis.

18. The system of claim 16, wherein said integrated metrology tool is located within said processing tool.

19. A computer readable program storage device encoded with instructions that, when executed by a computer, performs a method, comprising:
performing a first process on at least one semiconductor wafer;
acquiring data on at least one of a real-time basis and a near real-time basis, said data comprising at least one of a process state data, offline metrology data, a tool state data, and an integrated metrology data resulting from said first processing of semiconductor wafer;
storing said data in a database; and
performing a fault detection analysis based upon said data acquired from said database based upon a trigger signal that causes data to be extracted from said database on a substantially real time basis.

20. The computer readable program storage device encoded with instructions that, when executed by a computer, performs the method described in claim 19, the method further comprising performing a second process on a semiconductor wafer based upon processing modifications made in response to said fault detection.

21. The computer readable program storage device encoded with instructions that, when executed by a computer, performs the method described in claim 19, wherein acquiring metrology data resulting from said first process of semiconductor wafer further comprises acquiring integrated metrology data using an integrated metrology tool.

22. The computer readable program storage device encoded with instructions that, when executed by a computer, performs the method described in claim 19, wherein acquiring metrology data resulting from said first process of semiconductor wafer further comprises acquiring offline metrology data using an offline metrology tool.

23. The computer readable program storage device encoded with instructions that, when executed by a computer, performs the method described in claim 19, wherein storing said data in a database further comprises:
receiving data collection instructions from a data collection model, said data collection model based upon at least one business rule;
acquiring data incoming into the database based upon said collection instructions;
storing said incoming data into a storage unit in said database; and
processing said stored data in said database, said processing comprising at least one of combining, merging, expanding, and contracting at least portions of said data acquired by said database.

24. The computer readable program storage device encoded with instructions that, when executed by a computer, performs the method described in claim 23, wherein expanding said data further comprises attaching a process state data with a corresponding tool state data.

25. The computer readable program storage device encoded with instructions that, when executed by a computer, performs the method described in claim 19, wherein performing a fault detection analysis based upon said data acquired from said database on one of a real-time basis and a near real-time basis further comprises:
triggering said database for extracting said data;
analyzing said data triggered from said database;
detecting a fault based upon said analysis of said triggered data; and
performing a fault compensation process in response to a determination that a calculated fault is above a predetermined tolerance level.

26. The computer readable program storage device encoded with instructions that, when executed by a computer, performs the method described in claim 25, wherein triggering said database for extracting said data further comprises providing a triggering signal to said database to extract said data from said database.

27. The computer readable program storage device encoded with instructions that, when executed by a computer, performs the method described in claim 26, wherein triggering said database for extracting said data further comprises triggering said database at a rate that is substantially same as a rate of data flow into said database.

28. The computer readable program storage device encoded with instructions that, when executed by a computer, performs the method described in claim 26, wherein triggering said database for extracting said data further comprises triggering said database at a rate that is lower than the rate of data flow into said database.

29. The computer readable program storage device encoded with instructions that, when executed by a computer, performs the method described in claim 19, wherein storing said data in a database further comprises storing said data in a real-time database.

* * * * *